(12) United States Patent
Lindsey, Jr.

(10) Patent No.: US 8,445,361 B1
(45) Date of Patent: May 21, 2013

(54) METHOD OF DIVIDING A SEMICONDUCTOR WAFER HAVING SEMICONDUCTOR AND METAL LAYERS INTO SEPARATE DEVICES

(76) Inventor: Paul C. Lindsey, Jr., Lafayette, CA (US)

( * ) Notice: Subject to any disclaimer, the term of this patent is extended or adjusted under 35 U.S.C. 154(b) by 0 days.

(21) Appl. No.: 13/200,688

(22) Filed: Sep. 28, 2011

(51) Int. Cl.
*H01L 21/00* (2006.01)
(52) U.S. Cl.
USPC .............. 438/462; 257/620; 257/E21.596
(58) Field of Classification Search
USPC .............. 438/68, 113, 114, 458, 460–465, 438/FOR. 386; 257/620, E21.596, E21.599
See application file for complete search history.

(56) References Cited

U.S. PATENT DOCUMENTS

| 5,501,893 | A | 3/1996 | Laermer et al. |
| 6,417,013 | B1 | 7/2002 | Teixeira et al. |
| 2004/0110316 | A1* | 6/2004 | Ogihara et al. ............. 438/26 |
| 2010/0026779 | A1* | 2/2010 | Yonehara et al. .......... 347/238 |
| 2012/0156820 | A1* | 6/2012 | Kim ............................. 438/50 |

OTHER PUBLICATIONS

U.S. Appl. No. 13/136,460, filed Aug. 2, 2011, Lindsey.

* cited by examiner

*Primary Examiner* — Tony Tran
(74) *Attorney, Agent, or Firm* — Thomas R. Lampe

(57) ABSTRACT

A method of dividing a semiconductor wafer having a metal layer includes removing all or substantially all of the semiconductor material in scribe streets while the wafer is supported by a support, turning over the wafer and while using a second support to support the wafer, introducing a heat energy flux into the metal layer to remove metal of the metal layer from the scribe streets.

7 Claims, 3 Drawing Sheets

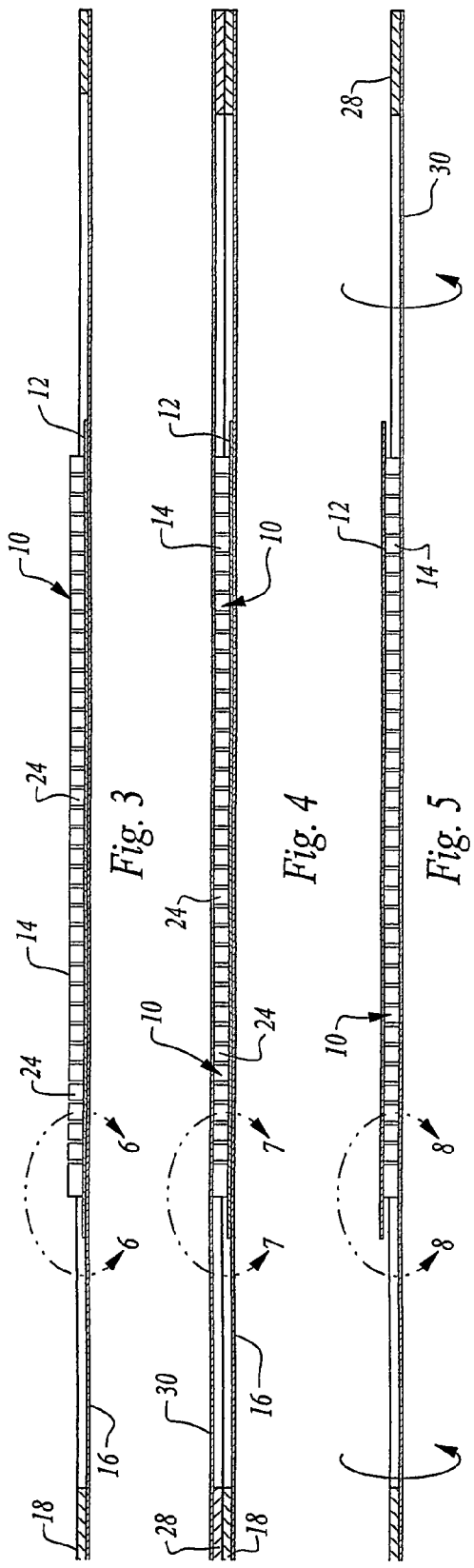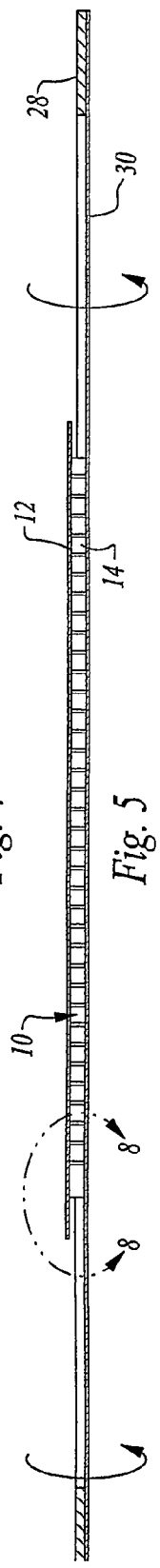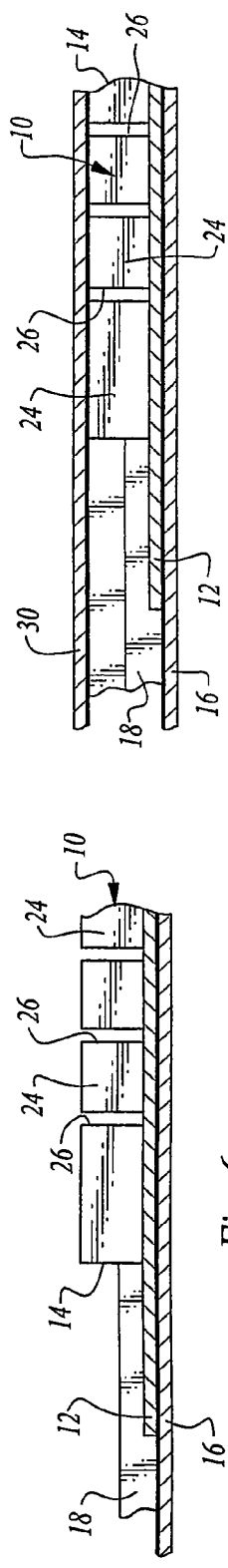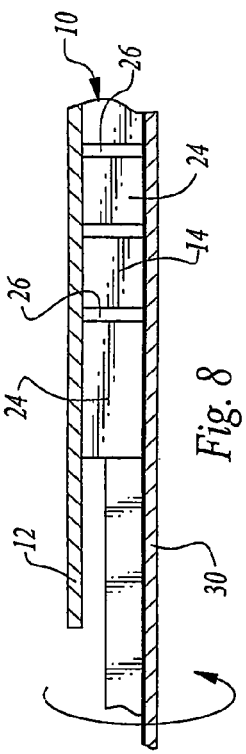

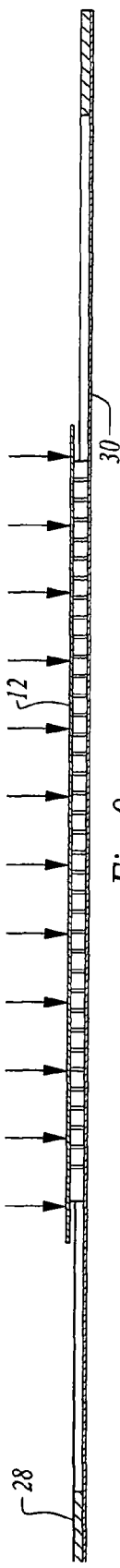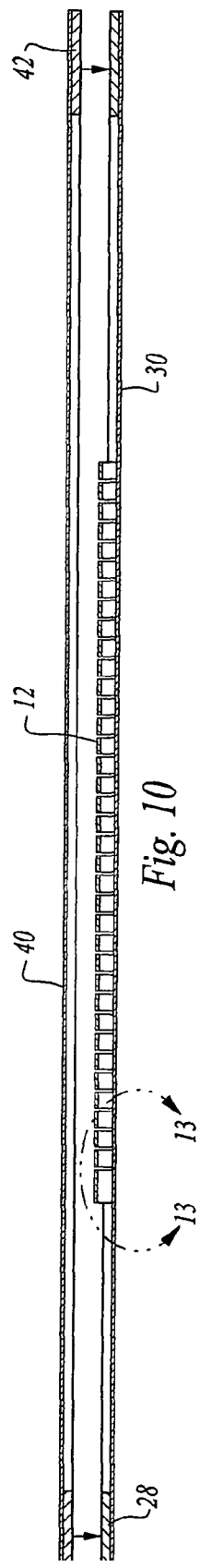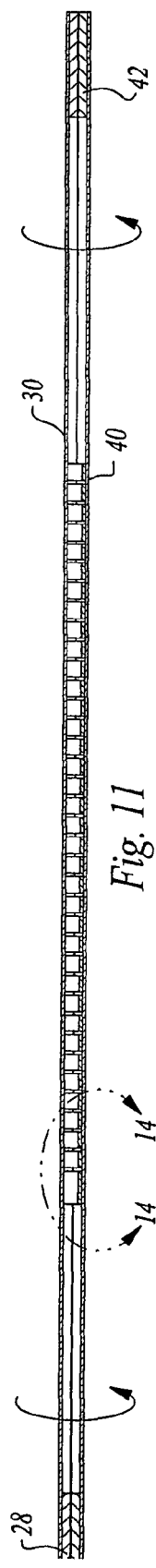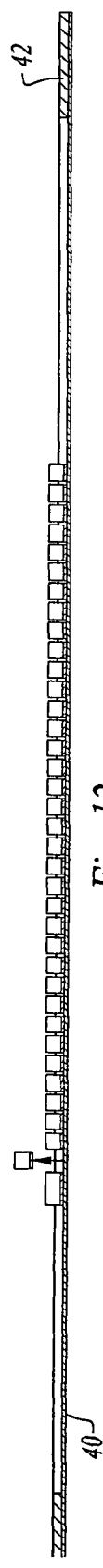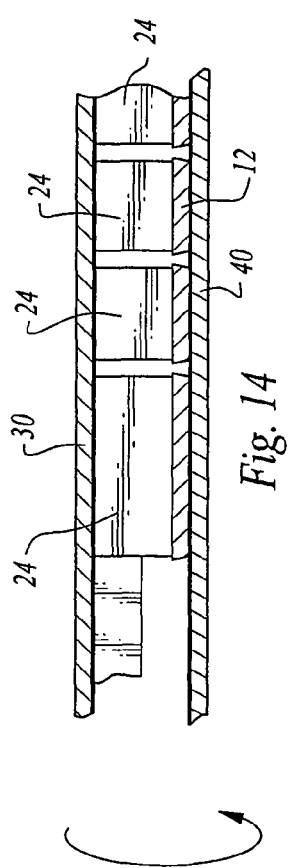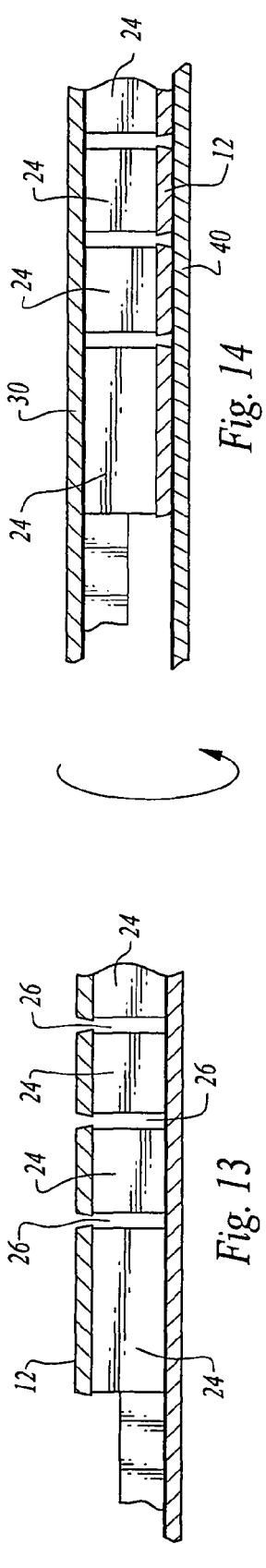

METHOD OF DIVIDING A SEMICONDUCTOR WAFER HAVING SEMICONDUCTOR AND METAL LAYERS INTO SEPARATE DEVICES

TECHNICAL FIELD

This invention relates to a method of separating semiconductor devices from a semiconductor wafer.

BACKGROUND OF THE INVENTION

In the past, numerous different methods have been used for singulating or dicing a semiconductor wafer, the process of dividing a semiconductor wafer into individual devices. The two most widely used methods at this time are sawing using a diamond saw blade and laser scribing using a focused laser beam to cut through the wafer. Neither method is ideal. Both result in a significant loss of material during the cutting process. As the size of semiconductor devices get smaller, the width of the line of lost material during the scribing process becomes comparable to the width of the device. If the width of the line of material lost during the scribing process could be made significantly smaller, many more devices could be made on each wafer, resulting in a large savings in the cost of fabricating the devices. In addition, both sawing and laser scribing cause damage along the cut edges of the devices that can result in rejected devices during visual inspection and in some cases cracking that can cause device failure in the field.

Since the invention of plasma and reactive ion etching in the 1970s, many have proposed using these processes for wafer singulation. These processes potentially could decrease the material loss during the dicing process by etching very narrow scribe lines through the semiconductor wafer. In addition, since the etch process takes place at a microscopic level, the edges of the semiconductor devices are not damaged by the process. In order for a plasma etching or a reactive ion etching process to be effective in wafer dicing, it would have to etch very deep, narrow trenches in the scribe streets of the semiconductor wafer and it would have to etch at a very fast etch rate to be economically attractive. These two conditions have been achieved in the last several years by employing the teachings of Teixeira, et al. (U.S. Pat. No. 6,417,013) building on the work of Laermer, et al. (U.S. Pat. No. 5,501,893). An issue that remains to be resolved is a cost effective method of removing the back metal that remains in the scribe street after the etch process is completed.

Semiconductor wafers usually have one or more metal layers applied to the back of the wafer during fabrication to provide ohmic contact and/or ease of die attach during packaging of the devices. These layers of metal are not readily etched using dry etch processes. My co-pending U.S. patent application Ser. No. 13/136,460, filed Aug. 2, 2011 discloses a method of effectively removing these metal layers in the semiconductor wafer scribe streets; more particularly, the method is for dividing a semiconductor wafer having a metal layer attached to a semiconductor material layer and intersecting scribe streets into separate individual devices.

The wafer is mounted on a first support with the metal layer adhesively attached to the first support whereby the first support supports the wafer.

While the metal layer is adhesively attached to the first support, the semiconductor material in the scribe streets is removed to form individual semiconductor material dies, each incorporating a device, without removing the metal layer from the scribe streets.

The semiconductor material dies of the semiconductor material layer are adhesively attached to a second support.

While employing the second support to support the wafer, the first support is released from adhesive attachment to the metal layer and the first support removed from the metal layer to expose the metal layer.

While continuing to employ the second support to support the wafer, the metal layer is cut along the scribe streets by a cutting tool made from hard material, the cutting tool having a sharp edge.

DISCLOSURE OF INVENTION

This invention also relates to a method of dividing a semiconductor wafer having a metal layer attached to a semiconductor material layer and intersecting a scribe streets into separate individual devices.

While the metal layer is attached to a first support, all or substantially all of the semiconductor material is removed in the scribe streets to form individual semiconductor material dies, each incorporating a device, without removing the metal layer from the scribe streets.

The wafer is turned over and while employing a second support to support the overturned wafer, a heat energy flux is introduced into the metal layer to heat the metal layer and raise the temperature of the metal layer in the scribe streets to a level approaching the metal melting point to remove at least some of the metal of the metal layer from the scribe streets.

Other features, advantages and objects of the present invention will become apparent with reference to the following description and accompanying drawings.

BRIEF DESCRIPTION OF DRAWINGS

FIG. 3 is an enlarged, cross-sectional view taken along the line 3-3 of FIG. 1;

FIG. 4 is an enlarged, cross-sectional view illustrating the first and second frames illustrated in FIG. 2 in engagement and the plastic sheet surrounded by the first frame adhesively attached to the dies of the semiconductor material layer of the wafer;

FIG. 5 is a view similar to FIG. 4, but illustrating the wafer having been turned upside down so that the metal base is above the layer of semiconductor material and with the frame and plastic film formerly attached to the metal layer having been removed;

FIG. 6 is an enlarged, cross-sectional view of the structural portion defined by arrow headed line 6-6 of FIG. 3;

FIG. 7 is an enlarged, cross-sectional view of the structural portion defined by arrow headed line 7-7 of FIG. 4;

FIG. 8 is an enlarged, cross-sectional view of the structural portion defined by arrow headed line 8-8 of FIG. 5;

FIG. 9 is an enlarged, cross-sectional view illustrating the metal base in the position shown in FIG. 5 being exposed to gas plasma and ion flux;

FIG. 10 is an enlarged, cross-sectional view illustrating metal of the metal plate in the scribe streets having been removed to separate the dies of the wafer and a frame mounted plastic sheet being lowered into engagement with the metal layer of the dies for adhesive attachment with the metal layer;

FIG. 11 is an enlarged, cross-sectional view showing the wafer comprised of separate dies having been turned over so that the metal layer is on the bottom;

FIG. 12 is an enlarged, cross-sectional view illustrating the turned over wafer, the frame and plastic film formerly attached to the layer of semi-conductor material having been removed;

FIG. 13 is an enlarged, cross-sectional view of the structure portion defined by arrow headed line 13-13 of FIG. 10; and FIG. 14 is an enlarged, cross-sectional view of the structural portion defined by arrow headed line 14-14 of FIG. 11.

BEST MODE FOR CARRYING OUT THE INVENTION

Figure 1:
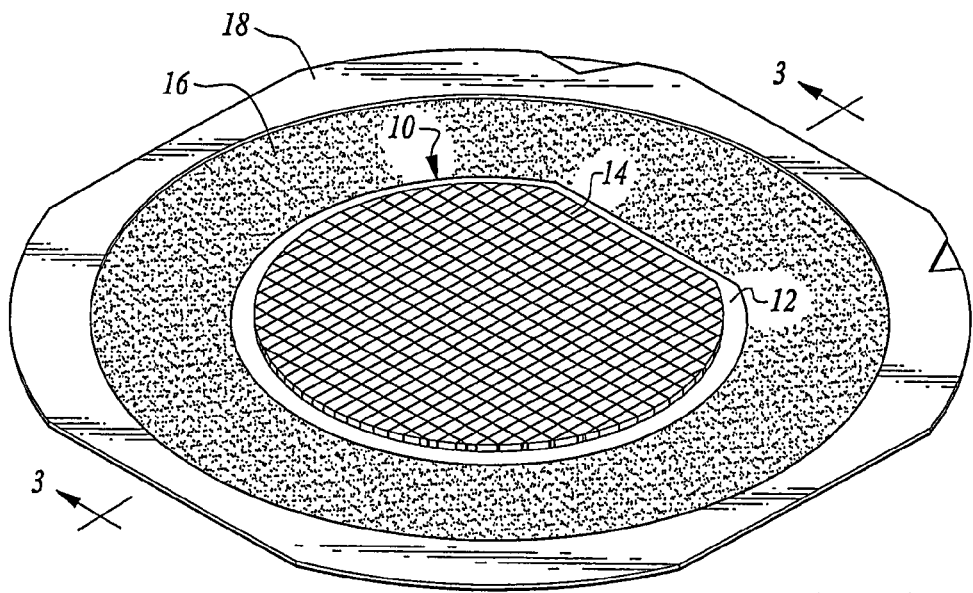
FIG. 1 is a top, perspective view illustrating a semiconductor wafer having a metal layer base adhesively secured to and supported by a plastic sheet surrounded by a frame and a semiconductor material layer which has been etched along scribe streets, the metal layer in the scribe streets not having been etched.
Figure 2:
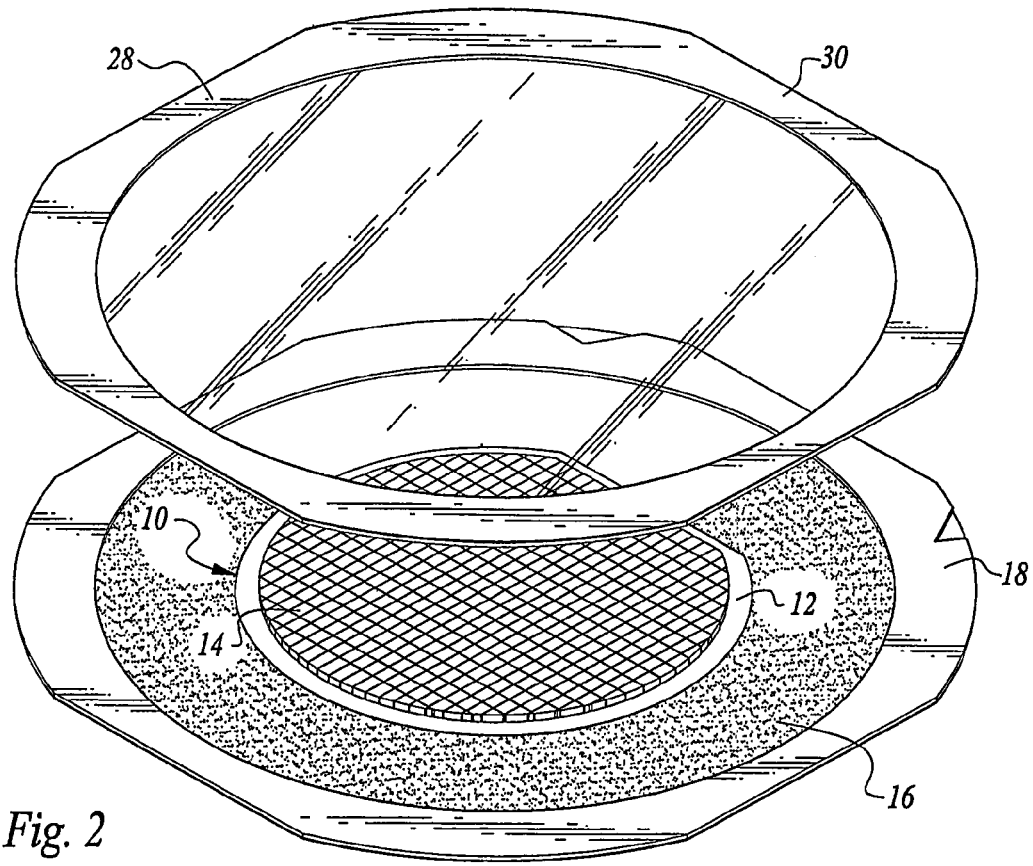
FIG. 2 is a top, perspective view illustrating a second plastic film and frame structure being lowered into position with respect to the wafer, plastic sheet and frame illustrated in FIG. 1.

Referring now to the drawings, a semiconductor wafer 10 is illustrated, the wafer having a metal layer or base 12 and a semiconductor material layer 14. The semiconductor material layer 14 of the wafer shown in FIGS. 1-8 has been etched along scribe streets to form individual semiconductor material dies but leaving the metal layer 12 intact, even in the scribe streets.

A commercially available etching machine of any suitable type may be employed to etch the semiconductor material to remove semiconductor material in the scribe streets but leaving the metal unetched. That is, the etching process illustrated in FIG. 11 is continued in the normal fashion until the metal layer on the back side of the wafer is reached.

It is current practice to mount a semiconductor wafer to be diced or singulated on a plastic film that is stretched across a metal or plastic frame. The plastic film is usually coated with an adhesive layer that is released by exposure to ultra violet radiation.

In the arrangement illustrated, the metal layer 12 of the wafer 10 is adhesively attached to a plastic film 16 coated with an adhesive layer that is released by exposure to ultra violet radiation stretched on a frame 18. FIG. 1 shows the wafer, plastic film 16 and frame 18 removed from the etching or scribing machine after the above described scribing of the semiconductor material layer has been accomplished. The individual semiconductor material dies 24 are separated along intersecting scribe streets 26 extending across the wafer.

A second frame 28 is lowered into engagement with frame 18 and the plastic film 30 attached to frame 28, which is also coated with an adhesive layer that is released by exposure to ultra violet radiation, is adhesively attached to the semiconductor material dies 24. See FIGS. 4 and 7. The assembly thus created is then turned over (see FIGS. 5 and 8) and exposed to ultra violet radiation. This releases plastic film 16 from the wafer and exposes the outer surface of the metal layer 12, the condition shown in FIGS. 5 and 8. The removed plastic film 16 and associated frame 18 are then completely removed from the assembly. Since the body of the wafer and the back metal layer 12 prevent the UV radiation from reaching the UV adhesive on plastic film 30, the wafer remains firmly attached to plastic film 30 at the outer surface of each die after film 16 and frame 18 are removed. The back metal layer 12 is now easily accessed for further processing.

FIG. 9 shows the wafer in the same position as indicated in FIGS. 5 and 8, and a heat energy flux introduced into the metal layer 12 to heat he metal layer and raise the temperature of the metal in the scribe streets to a level approaching the metal melting point to remove metal of the metal layer from the scribe streets. More particularly, in the embodiment illustrated the metal layer is exposed to gas plasma and ion flux produced by ion etching apparatus. The back metal layer is typically, but not necessarily, one to two microns thick and the scribe streets that have been etched are typically, but not necessarily, ten to fifteen microns wide.

The metal layer portions left in the scribe streets prior to exposure to the gas plasma and ion flux in the etching system have essentially nothing under them in the scribe streets.

The portions are suspended between the metal layer where attached to semiconductor material dies 24. That is, the metal layer portions span the etched voids formed in the scribe streets. Other than at the suspended portions thereof, the metal layer is firmly attached to the semiconductor material layer dies and provides good electrical and thermal contact between the metal layer and the semiconductor material dies.

The ion etching apparatus or system utilized to expose the metal layer to gas plasma and ion flux may be of any suitable commercially available type. When utilizing the ion etching system, the assembly of wafer, frame 28 and plastic film 30 is placed in the ion etching system. The system may be a sputter etch system, a reactive ion etch system, or an ion beam system, all of which are known in the art. The gases chosen for the projection of the ions may or may not be chemically reactive depending on the metals used in the back metal layers.

When the back metal layer is exposed to a plasma and ion flux in the etching system, the metal layer is caused to increase in temperature due to three effects: Heating due to ion bombardment, RF heating due to eddy currents, and gas heating.

This heat energy generated in the metal layer by the gas plasma and ion flux is carried away from the metal layer on the back of the semiconductor dies by thermal flow into the body of the dies at the locations where the metal layers attached to the semiconductor material dies.

The heat energy from the metal layer portions spanning the scribe streets is essentially entirely carried away through the sides of the metal layer portions, which limits heat loss from the metal layer portions. Thus, the metal layer portions heat up more rapidly than the remainder of the metal layer. As the melting point of the metal in the metal layer portions above the etched scribe streets is approached, the rate of metal removal from the area of the metal layer portions by the impinging ions increases very rapidly. This results in the metal in the scribe streets, i.e. the spanning metal layer portions, being removed very rapidly relative to the removal rate of the metal affixed to the back of the semiconductor material dies. As more metal is removed by the ions striking the surface of the metal, the thermal path in the metal layer over the scribe streets becomes even narrower, the temperature of the surface rises faster, and the metal removal rate accelerates until the bulk of the metal is removed from the etched scribe streets.

The metal backing layer outside the spanning portions at the scribe streets will retain its normal thickness to perform its usual functions. FIGS. 10 and 13 illustrate the condition of the wafer after the metal of the metal layer portions is removed from the scribe streets 26.

After most of the metal in the scribe streets has been removed, as illustrated in FIG. 10, another film 40 mounted on a frame 42 is adhesively secured to the metal layer of the dies and the frames 28, 42 are attached. At this point of the operation the frames and wafer are turned over so that the film 40 is under the segmented metal layer, that layer being located under the segmented semiconductor material layer. This condition is shown in FIGS. 11 and 14. Film 30 is now released from the semiconductor material dies and plastic film 40 and frame 42 become the support for the wafer. This is shown in FIG. 12. The semiconductor wafer, mounted face up on the new frame and film, is now ready for a pick-and-place operation as generally illustrated in FIG. 12.

As indicated above, methods other than employing gas plasma and ion flux from ion etching apparatus may be employed to introduce a flux of heat energy into the metal layer to accomplish the same result. For example, an inert gas can be heated using a plasma arc jet torch and the surface impinged by the hot gas. Another possible approach would be to place the wafer between two parallel metal plates and apply radio frequency energy to the plates, inducing eddy currents in the metal and causing the surface of the metal to heat up.

The invention claimed is:

1. A method of dividing a semiconductor wafer having a metal layer attached to a semiconductor material layer and intersecting scribe streets into separate individual devices, said method comprising the steps of:

while said metal layer is attached to a first support, removing all or substantially all of the semiconductor material in the scribe streets to form individual semiconductor material dies, each incorporating a device, without removing the metal layer from the scribe streets;

turning over said wafer;

while employing a second support to support said overturned wafer, introducing a heat energy flux into the metal layer to heat the metal layer and raise the temperature of the metal layer in the scribe streets to a level approaching or reaching the metal melting point to remove at least some of the metal of the metal layer from the scribe streets, the heat energy in the metal layer carried away from the metal layer by thermal flow into the semiconductor material dies at the locations where the metal layer is attached to the semiconductor material dies and the heat energy from metal layer portions spanning the scribe streets carried away through the sides of the metal layer portions to limit heat loss from said metal layer portions whereby the metal layer portions heat up more rapidly than the remainder of said metal layer;

adhesively attaching a frame mounted plastic film to the metal layer after all or substantially all of the metal of the metal layer portions has been removed from the scribe streets to form an assembly; turning over the assembly; and after the assembly has been turned over, subjecting the assembly to UV radiation or other treatment to release adhesive attachment between the wafer and the plastic film of the assembly.

2. The method according to claim 1 wherein heating of the metal layer in the scribe streets is at least partially caused by ion bombardment.

3. The method according to claim 1 wherein heating of the metal layer in the scribe streets is at least partially caused by RF heating due to eddy currents.

4. The method according to claim 1 wherein heating of the metal layer in the scribe streets is at least partially caused by gas heating.

5. The method according to claim 1 wherein the heating of the metal layer portions and removal of the metal layer portions due to heating continues until all or substantially all of the metal of the metal layer portions is removed from the scribe streets.

6. The method according to claim 5 wherein the rate of heating continuously intensifies until all or substantially all of the metal of the metal layer portions is removed from the scribe streets.

7. The method according to claim 1 wherein the step of introducing a heat energy flux into the metal layer is accomplished by exposing the metal layer to a source of gas plasma and ion flux.

\* \* \* \* \*